United States Patent
Choi

(10) Patent No.: US 9,170,295 B2
(45) Date of Patent: Oct. 27, 2015

(54) METHOD AND APPARATUS FOR DETECTING ARC IN PLASMA CHAMBER

(71) Applicant: NEW POWER PLASMA CO., LTD., Gyeonggi-do (KR)

(72) Inventor: Sang-Don Choi, Gyeonggi-do (KR)

(73) Assignee: NEW POWER PLASMA CO., LTD., Gyeonggi-do (KR)

(*) Notice: Subject to any disclaimer, the term of this patent is extended or adjusted under 35 U.S.C. 154(b) by 152 days.

(21) Appl. No.: 13/779,181

(22) Filed: Feb. 27, 2013

(65) Prior Publication Data

US 2013/0221847 A1 Aug. 29, 2013

(30) Foreign Application Priority Data

Feb. 28, 2012 (KR) .................. 10-2012-0020659

(51) Int. Cl.
 H01J 7/24 (2006.01)
 G01R 31/24 (2006.01)
 H05H 1/46 (2006.01)
 G01R 19/00 (2006.01)
 H05H 1/00 (2006.01)
 H01J 37/32 (2006.01)
 G01R 27/08 (2006.01)

(52) U.S. Cl.
 CPC .......... G01R 31/245 (2013.01); G01R 19/0061 (2013.01); H01J 37/32082 (2013.01); H01J 37/32944 (2013.01); H05H 1/0081 (2013.01); H05H 1/46 (2013.01); G01R 27/08 (2013.01)

(58) Field of Classification Search
 USPC ........................................ 315/111.21, 111.41
 See application file for complete search history.

(56) References Cited

U.S. PATENT DOCUMENTS

| | | | | | |
|---|---|---|---|---|---|
| 5,770,922 | A | * | 6/1998 | Gerrish | H01J 37/32082 219/121.21 |
| 5,971,591 | A | * | 10/1999 | Vona | H01J 37/32935 219/121.54 |
| 6,326,584 | B1 | * | 12/2001 | Jewett | H01J 37/32082 219/121.54 |
| 6,449,568 | B1 | * | 9/2002 | Gerrish | H01J 37/32082 324/95 |
| 6,708,123 | B2 | * | 3/2004 | Gerrish | H01J 37/32082 324/95 |
| 7,115,210 | B2 | * | 10/2006 | Calderoni | G01M 3/40 118/712 |
| RE42,917 | E | * | 11/2011 | Hauer | H01J 37/32174 118/723 MW |
| 8,089,026 | B2 | * | 1/2012 | Sellers | B23K 10/00 204/192.13 |
| 8,179,152 | B2 | * | 5/2012 | Booth | H01J 37/32935 324/713 |
| 8,264,154 | B2 | * | 9/2012 | Banner | H01J 37/321 315/111.71 |
| 8,698,037 | B2 | * | 4/2014 | Mundt | H01L 21/67248 156/345.27 |
| 8,703,249 | B2 | * | 4/2014 | Tong | H01J 37/32082 427/569 |
| 2006/0011591 | A1 | * | 1/2006 | Sellers | B23K 10/00 219/121.54 |
| 2010/0033195 | A1 | * | 2/2010 | Booth | H01J 37/32935 324/663 |
| 2012/0259562 | A1 | * | 10/2012 | Booth | H01J 37/32935 702/58 |
| 2012/0316834 | A1 | * | 12/2012 | Booth | H01J 37/32935 702/183 |
| 2013/0002136 | A1 | * | 1/2013 | Blackburn | H01J 37/32183 315/111.21 |

* cited by examiner

Primary Examiner — Tung X Le
Assistant Examiner — Srinivas Sathiraju
(74) Attorney, Agent, or Firm — IP & T Group LLP

(57) ABSTRACT

An apparatus for detecting an arc in a plasma chamber is designed to detect the respective voltage and current values of RF power supplied to the plasma chamber and calculate the ratio of the voltage and current values to accomplish a required control of the supplying of the power. When it is determined that the arc is generated, the apparatus rapidly controls the supplying of the power to prevent damages on the plasma chamber and contaminations on the materials to be processed due to the generation of the arc.

10 Claims, 2 Drawing Sheets

METHOD AND APPARATUS FOR DETECTING ARC IN PLASMA CHAMBER

CROSS-REFERENCE TO RELATED APPLICATION

This application claims priority of Korean patent application numbers 10-2012-0020659 filed on Feb. 28, 2012. The disclosure of each of the foregoing applications is incorporated herein by reference in its entirety.

FIELD OF THE INVENTION

The present invention relates to a method and apparatus for detecting an arc generated in a load where a power is consumed, and more particularly to a method and apparatus for detecting an arc generated in a plasma processing chamber where a radio frequency (RF) power is used to generate plasma.

BACKGROUND OF THE INVENTION

An arc generated in a load where a power is consumed may cause damage to a power supply or the load. Although it is preferred to substantially prevent the generation of the arc, the arc may occur due to various factors. Therefore, technical efforts have been continued to detect the generation of arc to block the consecutive generation thereof.

In particular, for a plasma process where a RF power is used, the generated arc may damage a plasma chamber and contaminate the materials to be processed. In this regard, technologies have been suggested to detect the arc generated in the chamber and to rapidly block it. For example, there is a process comprising detecting unexpected changes in a reflected power, checking whether an arc is generated or not, and blocking or reducing a RF power supplied. However, it is difficult to increase its feasibility since the arc generated in the plasma chamber does not necessarily lead to the increase in the reflected power.

A semiconductor fabrication process using plasma requires very high precision. Accordingly, there is a need for a method and an apparatus to precisely detect the arc generated in the chamber and rapidly control the supplying of power.

SUMMARY OF THE INVENTION

An object of the present invention is to provide a method and an apparatus for detecting an arc in a plasma chamber, which is capable of precisely detecting an arc generated in a plasma chamber.

An aspect of the present invention is directed to an apparatus for detecting an arc in a plasma chamber. The apparatus comprises a voltage sensor for detecting a voltage value of a radio frequency (RF) power supplied from a power supply to the plasma chamber; a current sensor for detecting a current value of the RF power; a voltage and current ratio detection circuit for receiving the voltage and current values detected by the voltage sensor and the current sensor to calculate the voltage and current ratio; and a controller for determining whether the arc is generated or not based on the voltage and current ratio calculated in the voltage and current ratio detection circuit.

According to one illustrative embodiment of the present invention, when the controller determines that the arc is generated in the plasma chamber, it controls to reduce the supplying of the RF power from the power supply.

According to another illustrative embodiment of the present invention, when the controller determines that the arc is generated in the plasma chamber, it controls to block the supplying of the RF power from the power supply.

According to still another illustrative embodiment of the present invention, when the controller determines that the arc is generated in the plasma chamber, it controls first to reduce the supplying of the RF power from the power supply, and then block the supplying of the power.

According to still yet another illustrative embodiment of the present invention, it further comprises a reflected power detector for detecting a reflected power of the RF power supplied from the power supply to the plasma chamber; a comparator circuit for comparing a reflected power value detected by the reflected power detector with a reference value; and a logic circuit for logically calculating a value compared in the comparator circuit and a value of the voltage and current ratio from the voltage and current ratio detection circuit and providing the resulting logical value to the controller.

According to still yet another illustrative embodiment of the present invention, the controller performs the control of the power supply based on the logical value provided by the logic circuit.

Another aspect of the present invention is directed to a method for detecting an arc in a plasma chamber, comprising the steps of: detecting a voltage value of a RF power supplied from a power supply to the plasma chamber; detecting a current value of the RF power; calculating a value of a voltage and current ratio with the detected voltage and current values; and determining whether the arc is generated or not in the plasma chamber based on the calculated value of the voltage and current ratio.

According to one illustrative embodiment of the present invention, when it is determined that the arc is generated, the step of determining whether the arc is generated or not further comprises controlling the supplying of the RF power from the power supply.

According to another illustrative embodiment of the present invention, the controlling of the supplying of the RF power includes reducing the supplying of the RF power.

According to still another illustrative embodiment of the present invention, the controlling of the supplying of the RF power includes blocking the supplying of the RF power.

According to still yet another illustrative embodiment of the present invention, the controlling of the supplying of the RF power includes reducing and then blocking the supplying of the RF power.

According to still yet another illustrative embodiment of the present invention, it further comprises the step of detecting a reflected power value of the RF power supplied from the power supply to the plasma chamber, and the step of determining whether the arc is generated or not is determined based on the detected reflected power value.

The method and the apparatus for detecting an arc in a plasma chamber according to the present invention detect the changes in a voltage and current ratio of the RF power supplied to the plasma chamber to check the generation of arc, and, then, when the control of the power supply is required, rapidly reduce or block the RF power output from the power supply to prevent damage to the plasma chamber and contamination to the materials to be processed by the generation of arc.

BRIEF DESCRIPTION Of THE DRAWINGS

To enable persons skilled in the art to fully understand the objectives, features, and advantages of the present invention, the present invention is hereunder illustrated with specific embodiments in conjunction with the accompanying drawings, in which.

DETAILED DESCRIPTION OF THE PREFERRED EMBODIMENTS

The present invention now will be described more fully hereinafter with reference to the accompanying drawings, in which some, but not all, embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

Figure 1:
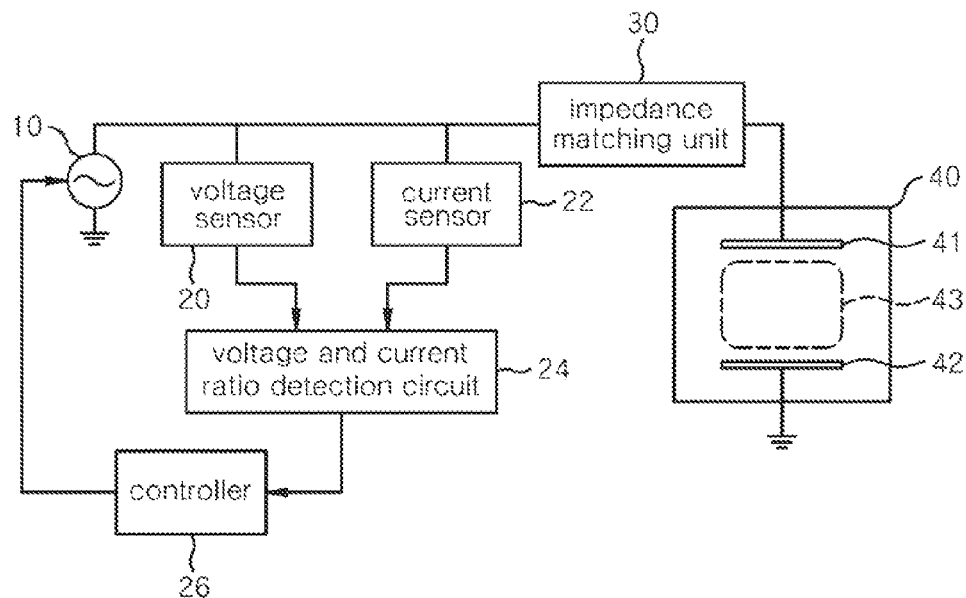
FIG. 1 is a block diagram showing an apparatus for detecting an arc in a plasma chamber according to a first embodiment of the present invention.

FIG. 1 is a block diagram showing an apparatus for detecting an arc in a plasma chamber according to a first embodiment of the present invention.

Referring to FIG. 1, the arc detection apparatus according to a first embodiment of the present invention is designed to detect an arc generated in the plasma chamber 40 and subsequently control a power supply 10 to prevent damages on the plasma chamber and contaminations on the material to be processed due to the generation of arc.

The RF power generated from the power supply 10 is supplied through an impedance matching unit 30 to an upper electrode 41 and a lower electrode 42 configured in the plasma chamber 40. When process gas and RF power are supplied into the plasma chamber 40, plasma 43 is generated between the upper electrode 41 and the lower electrode 42. During the supplying of the RF power, the impedance matching unit 30 operates as the impedance of the plasma 43 generated in the plasma chamber 40 varies, and thus yields an appropriate impedance matching. However, since, when rapid voltage-current changes, i.e., arc, are occurred, it is difficult to control the impedance by the impedance matching unit 30, the arc detection and the smart control of the power supply 10 based on the arc detection are required.

The arc detection apparatus of the present invention is designed to detect the respective voltage and current of the RF power supplied from the power supply 10 to the plasma chamber 40 and calculate the ratio of the detected voltage and current values to accomplish a required control of the supplying of power.

The arc detection apparatus comprises a voltage sensor 20 and a current sensor 22. The voltage sensor 20 and the current sensor 22 detect a voltage and a current of the RF power supplied from the power supply 10 to the plasma chamber 40, respectively. The respective voltage and current values detected by the voltage sensor 20 and the current sensor 22 are provided to a voltage and current ratio detection circuit 24. The voltage and current ratio detection circuit 24 calculates the ratio of the detected voltage and current values and provides the ratio value to a controller 26. For example, for 50 ohm load, when 50 volts of voltage and 1 ampere of current are detected, it is regarded as a steady state. The controller 26 determines whether an arc is generated or not, while comparing the voltage and current ratio value provided from the voltage and current ratio detection circuit 24 with a reference value of the steady state. When the controller 26 determines that the arc is generated, it controls the power supply 10 to reduce the supplying of the power, or, when the arc is consecutively generated, block the supplying of the power.

Figure 2:
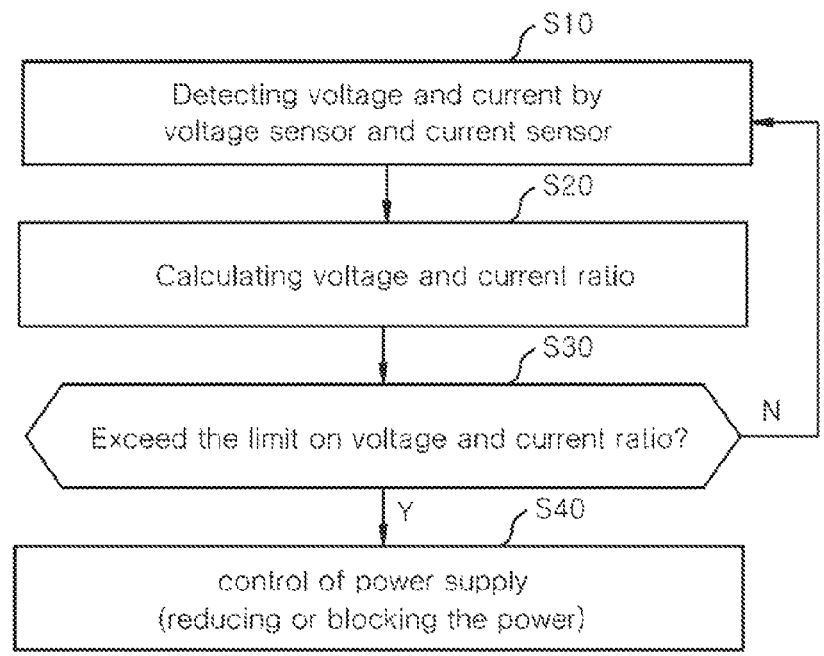
FIG. 2 is a flow diagram showing an operating process for the arc detection apparatus of FIG. 1.

FIG. 2 is a flow diagram showing an operating process for the arc detection apparatus of FIG. 1.

Referring to FIG. 2, the arc detection apparatus as described herein above is designed to detect a voltage and a current using the voltage sensor 20 and the current sensor 22 in step S10. In step S20, the ratio of the voltage and current values detected by the voltage and current ratio detection circuit 20 is computed and provided to the controller 26. In step S30, the controller 26 compares the value of the voltage and current ratio provided from the voltage and current ratio detection circuit 24 with a reference value, and determines whether the arc is generated or not. When the controller 26 determines that the arc is generated, the power supply 10 is controlled to reduce the RF power, or, if desired, is blocked by the controller 26.

Figure 3:
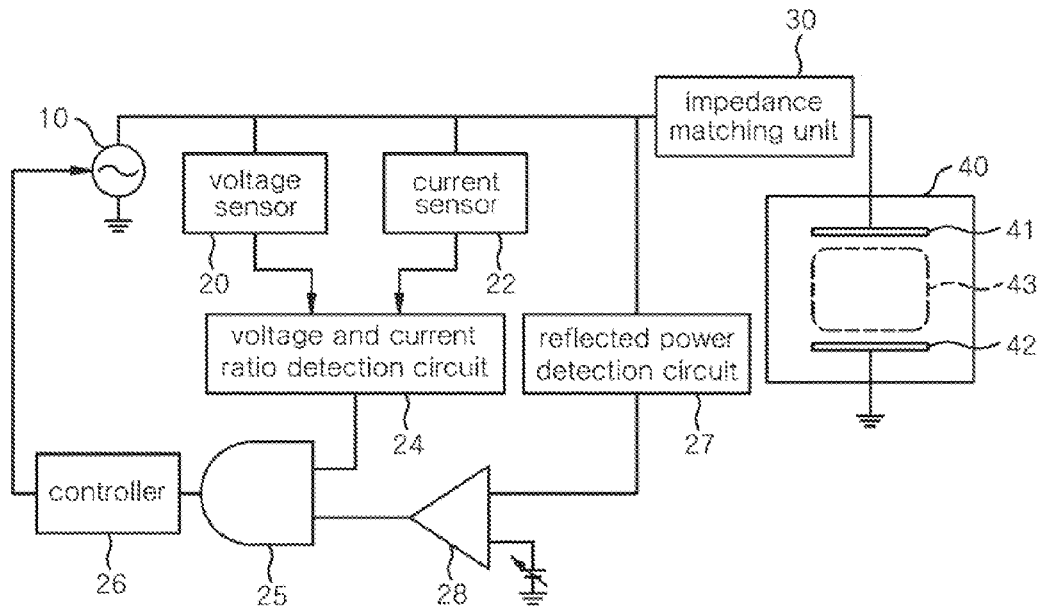
FIG. 3 is a block diagram showing an apparatus for detecting an arc in a plasma chamber according to a second embodiment of the present invention.
Figure 4:
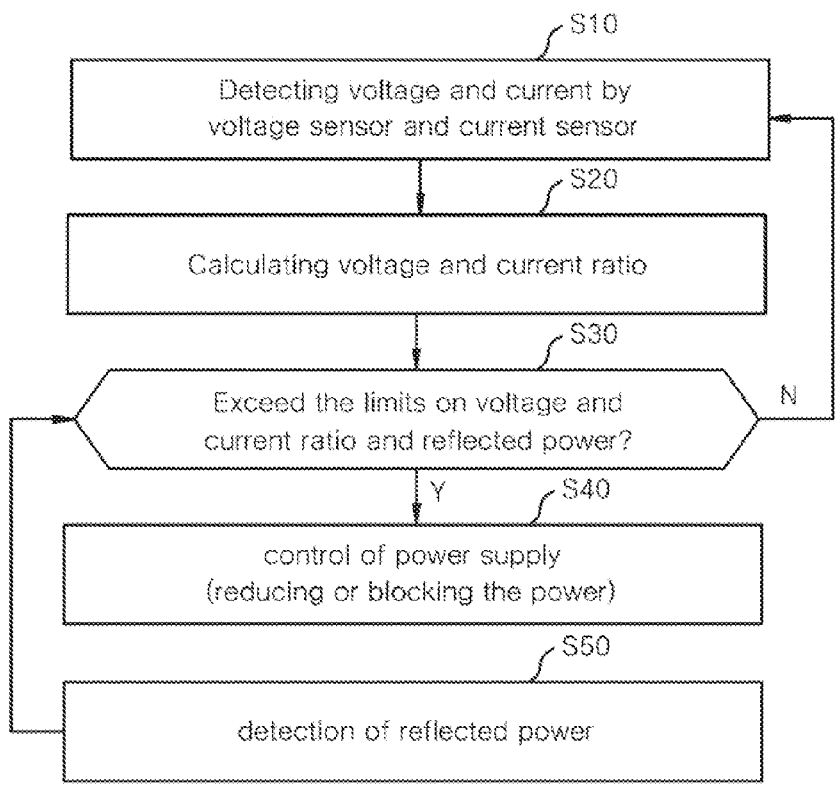
FIG. 4 is a flow diagram showing an operating process for the arc detection apparatus of FIG. 3.

FIG. 3 is a block diagram showing an apparatus for detecting an arc in a plasma chamber according to a second embodiment of the present invention, and FIG. 4 is a flow diagram showing an operating process for the arc detection apparatus of FIG. 3.

Referring to FIGS. 3 and 4, the configuration of the arc detection apparatus according to the second embodiment of the present invention is essentially identical to that of the first embodiment of the present invention as described above. Therefore, the repetitive descriptions of the identical configuration are omitted. The arc detection apparatus according to the second embodiment of the present invention further comprises detecting the changes in a reflected power to determine whether the arc is generated or not. A reflected power detection circuit 27 detects the reflected power provided to and reflected to the plasma chamber 40. The detected reflected power value is provided to a comparator circuit 26. The comparator circuit 26 compares the reflected power value with a reference value set in a reference value setup part 29, and provides the resulting comparison operation value to a logic circuit 25. The logic circuit 25 logically calculates the comparison operation value input by the comparator circuit 28, and the voltage and current ratio detection value provided by the voltage and current ratio detection circuit 24, and provides the resulting logical operation value to the controller 26. The controller 26 determines whether the arc is generated or not based on the logical operation value provided by the logic circuit 25, and, when it is determined that the arc is generated, the controller 26 orders to reduce the RF power, or, if necessary, block the supplying of the power.

The foregoing embodiments of the method and the apparatus for detecting an arc in a plasma chamber according to the present invention are illustrative, not limiting thereto. The present invention is applicable to a method and an apparatus for detecting an arc in a plasma chamber having different purposes.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An apparatus for detecting an arc in a plasma chamber, comprising:
    a voltage sensor for detecting a voltage value of a radio frequency (RF) power supplied from a power supply to the plasma chamber;
    a current sensor for detecting a current value of the RF power;
    a voltage and current ratio detection circuit for receiving the voltage and current values detected by the voltage sensor and the current sensor to calculate the voltage and current ratio;
    a controller for determining whether the arc is generated or not based on the voltage and current ratio calculated in the voltage and current ratio detection circuit;
    a reflected power detector for detecting a reflected power of the RF power supplied from the power supply to the plasma chamber;
    a comparator circuit for comparing a reflected power value detected by the reflected power detector with a reference value; and
    a logic circuit for logically calculating a value compared in the comparator circuit and a value of the voltage and current ratio from the voltage and current ratio detection circuit, and providing the resulting logical value to the controller.

2. The apparatus of claim 1, wherein, when the controller determines that the arc is generated in the plasma chamber, it controls to reduce the supplying of the RF power from the power supply.

3. The apparatus of claim 1, wherein, when the controller determines that the arc is generated in the plasma chamber, it controls to block the supplying of the RF power from the power supply.

4. The apparatus of claim 1, wherein, when the controller determines that the arc is generated in the plasma chamber, it controls first to reduce the supplying of the RF power from the power supply, and then block the supplying of the power.

5. The apparatus of claim 1, the controller performs the control of the supplying of the power based on the logical value provided by the logic circuit.

6. A method for detecting an arc in a plasma chamber, comprising the steps of:
    detecting a voltage value of a RF power supplied from a power supply to the plasma chamber;
    detecting a current value of the RF power;
    calculating by a voltage and current detection circuit, a value of a voltage and current ratio with the detected voltage and current values;
    determining by a controller, whether the arc is generated or not in the plasma chamber based on the calculated value of the voltage and current ratio;
    detecting a reflected power value of the RF power supplied from the power supply to the plasma chamber;
    comparing by a comparator circuit, the reflected power value with a reference value;
    determining whether the arc is generated or not is determined based on the detected reflected power value; and
    calculating by a logic circuit, a value compared in the comparator circuit and a value of the voltage and current ratio from the voltage and current ratio detection circuit, and providing the resulting logical value to the controller.

7. The method of claim 6, wherein, when it is determined that the arc is generated, the step of determining whether the arc is generated or not further comprises controlling the supplying of the RF power from the power supply.

8. The method of claim 7, wherein the controlling of the supplying of the RF power includes reducing the supplying of the RF power.

9. The method of claim 7, wherein the controlling of the supplying of the RF power includes blocking the supplying of the RF power.

10. The method of claim 7, wherein the controlling of the supplying of the RF power includes reducing and then blocking the supplying of the RF power.

* * * * *